(12) United States Patent
Wang et al.

(10) Patent No.: US 11,716,860 B2
(45) Date of Patent: Aug. 1, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Po-Kai Hsu, Tainan (TW); Jing-Yin Jhang, Tainan (TW); Yu-Ping Wang, Hsinchu (TW); Hung-Yueh Chen, Hsinchu (TW); Wei Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 115 days.

(21) Appl. No.: 16/882,783

(22) Filed: May 26, 2020

(65) Prior Publication Data

US 2021/0343786 A1    Nov. 4, 2021

(30) Foreign Application Priority Data

Apr. 30, 2020    (CN) .......................... 202010361265.X

(51) Int. Cl.
*H10B 61/00* (2023.01)
*H10N 50/01* (2023.01)
*H10N 50/80* (2023.01)
*H10N 50/85* (2023.01)

(52) U.S. Cl.
CPC ............. *H10B 61/22* (2023.02); *H10N 50/01* (2023.02); *H10N 50/80* (2023.02); *H10N 50/85* (2023.02)

(58) Field of Classification Search
CPC ....... H01L 27/228; H01L 43/02; H01L 43/10; H01L 43/12; H01L 27/222; H01L 43/08; G11C 11/161; H10N 50/01; H10N 50/80; H10N 50/85; H10N 50/10; H10B 61/22; H10B 61/00
See application file for complete search history.

(56) References Cited

U.S. PATENT DOCUMENTS

| | | |
|---|---|---|
| 9,230,626 B2 | 1/2016 | Buhrman et al. |
| 10,529,920 B1 | 1/2020 | Feng |
| 2016/0300999 A1 | 10/2016 | Yi |
| 2016/0322090 A1 | 11/2016 | Chan |
| 2017/0092851 A1 | 3/2017 | Han |
| 2018/0350874 A1* | 12/2018 | Chuang ................. H01L 27/228 |
| 2020/0075670 A1 | 3/2020 | Lin |
| 2020/0127049 A1 | 4/2020 | Kalnitsky |
| 2021/0036054 A1* | 2/2021 | Gallagher ............... H01L 43/14 |
| 2021/0134339 A1* | 5/2021 | Song .................... G01R 33/093 |

FOREIGN PATENT DOCUMENTS

WO    2016/048757 A1    3/2016

\* cited by examiner

*Primary Examiner* — Syed I Gheyas
(74) *Attorney, Agent, or Firm* — Winston Hsu

(57) ABSTRACT

A method for fabricating a semiconductor device includes the steps of: forming a magnetic tunneling junction (MTJ) on a substrate; forming a first inter-metal dielectric (IMD) layer around the MTJ; forming a first metal interconnection adjacent to the MTJ; forming a stop layer on the first IMD layer; removing the stop layer to form an opening; and forming a channel layer in the opening to electrically connect the MTJ and the first metal interconnection.

5 Claims, 8 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of: forming a magnetic tunneling junction (MTJ) on a substrate; forming a first inter-metal dielectric (IMD) layer around the MTJ; forming a first metal interconnection adjacent to the MTJ; forming a stop layer on the first IMD layer; removing the stop layer to form an opening; and forming a channel layer in the opening to electrically connect the MTJ and the first metal interconnection.

According to another aspect of the present invention, a semiconductor device includes a magnetic tunneling junction (MTJ) on a substrate; a first inter-metal dielectric (IMD) layer around the MTJ; a first metal interconnection adjacent to the MTJ; and a channel layer on the first IMD layer to electrically connect the MTJ and the first metal interconnection.

According to yet another aspect of the present invention, a semiconductor device includes: a first metal interconnection and a second metal interconnection on a substrate; a first inter-metal dielectric (IMD) layer around the first metal interconnection and the second metal interconnection; a channel layer on the first IMD layer, the first metal interconnection, and the second metal interconnection; and a magnetic tunneling junction (MTJ) on the channel layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
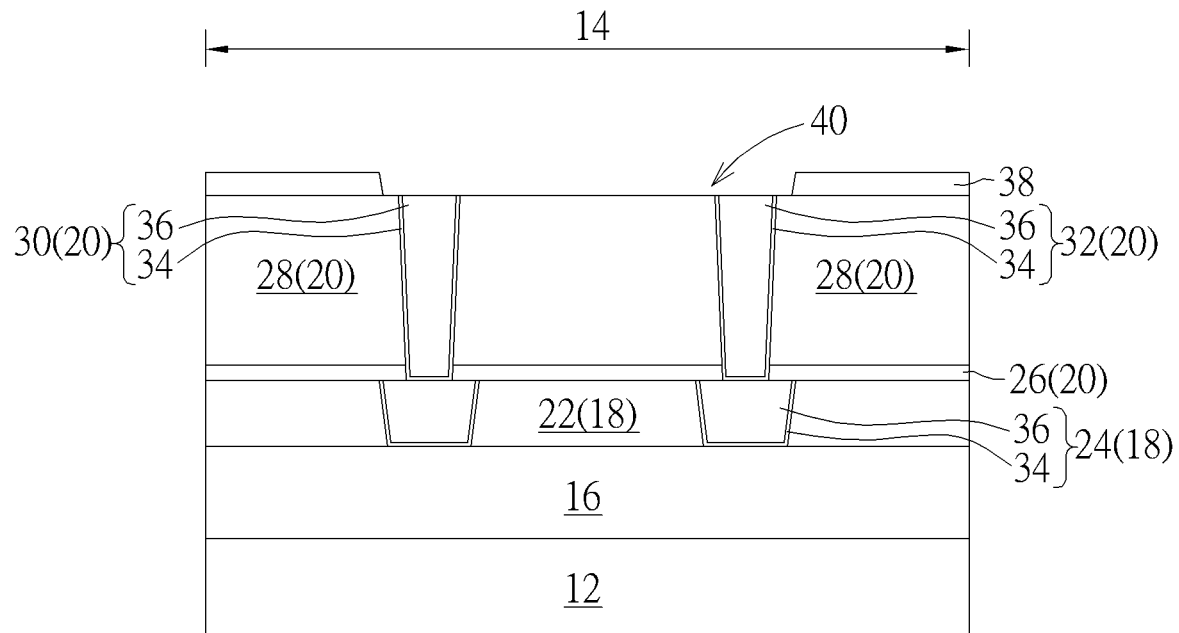
FIGS. 1-6 illustrate a method for fabricating a MRAM device according to an embodiment of the present invention.

Referring to FIGS. 1-6, FIGS. 1-6 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 18, 20 are sequentially formed on the ILD layer 16 to electrically connect the aforementioned contact plugs, in which the metal interconnect structure 18 includes an inter-metal dielectric (IMD) layer 22 and metal interconnections 24 embedded in the IMD layer 22, and the metal interconnect structure 20 includes a stop layer 26, an IMD layer 28, and metal interconnections 30, 32 embedded in the stop layer 26 and the IMD layer 28.

In this embodiment, each of the metal interconnections 24 from the metal interconnect structure 18 preferably includes a trench conductor and each of the metal interconnections 30, 32 from the metal interconnect structure 20 includes a via conductor. Preferably, each of the metal interconnections 24, 30, 32 from the metal interconnect structures 18, 20 could be embedded within the IMD layers 22, 28 and/or stop layer 26 according to a single damascene process or dual damascene process. For instance, each of the metal interconnections 24, 30, 32 could further include a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 in the metal interconnections 24 are preferably made of copper, the metal layers 36 in the metal interconnections 30, 32 are preferably made of tungsten, the IMD layers 22, 28 are preferably made of silicon oxide or ultra low-k (ULK) dielectric layer, and the stop layers 26 is preferably made of nitrogen doped carbide (NDC), silicon nitride, silicon carbon nitride (SiCN), or combination thereof.

Next, a stop layer 38 is formed on the IMD layer 28 and a photo-etching process is conducted to remove part of the stop layer 38 for forming an opening 40 exposing the metal interconnections 30, 32 and the IMD layer 28. In this embodiment, the stop layer 38 is preferably formed to accommodate a channel layer formed in the later process so that the thickness of the stop layer 38 is preferably maintained between 200 Angstroms to 300 Angstroms. Preferably, the stop layer 38 could include silicon dioxide ($SiO_2$), silicon nitride (SiN), or silicon carbon nitride (SiCN) and most preferably include SiCN.

Figure 2:
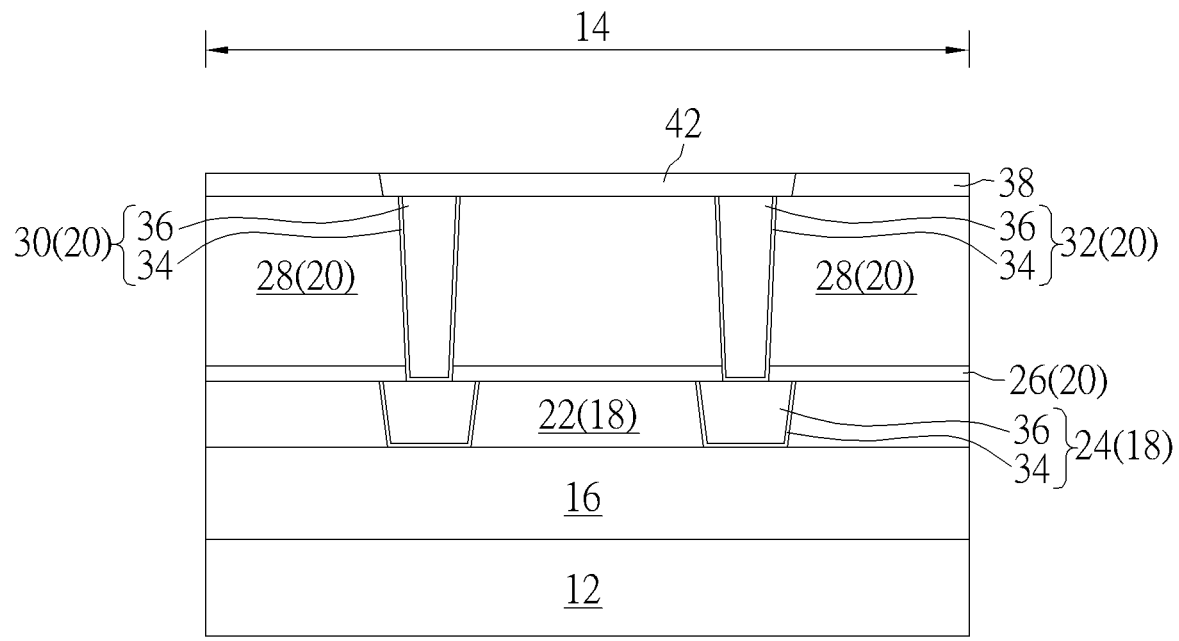

Next, as shown in FIG. 2, a channel layer 42 is formed into the opening 40 and on the stop layer 38 and a planarizing process such as chemical mechanical polishing (CMP) process is conducted to remove part of the channel layer 42 so that the top surface of the remaining channel layer 42 is even with the top surface of the stop layer 38. In this embodiment, the channel layer 42 is preferably serving as the channel for a spin orbit torque (SOT) MRAM and the material thereof could include tantalum (Ta), tungsten (W), platinum (Pt), hafnium (Hf), bismuth selenide ($Bi_xSe_{1-x}$), or combination thereof. Specifically, the channel layer 42 could include metals such as tantalum (Ta), tungsten (W), platinum (Pt), or hafnium (Hf) and/or topological insulator such as bismuth selenide ($Bi_xSe_{1-x}$).

Figure 3:
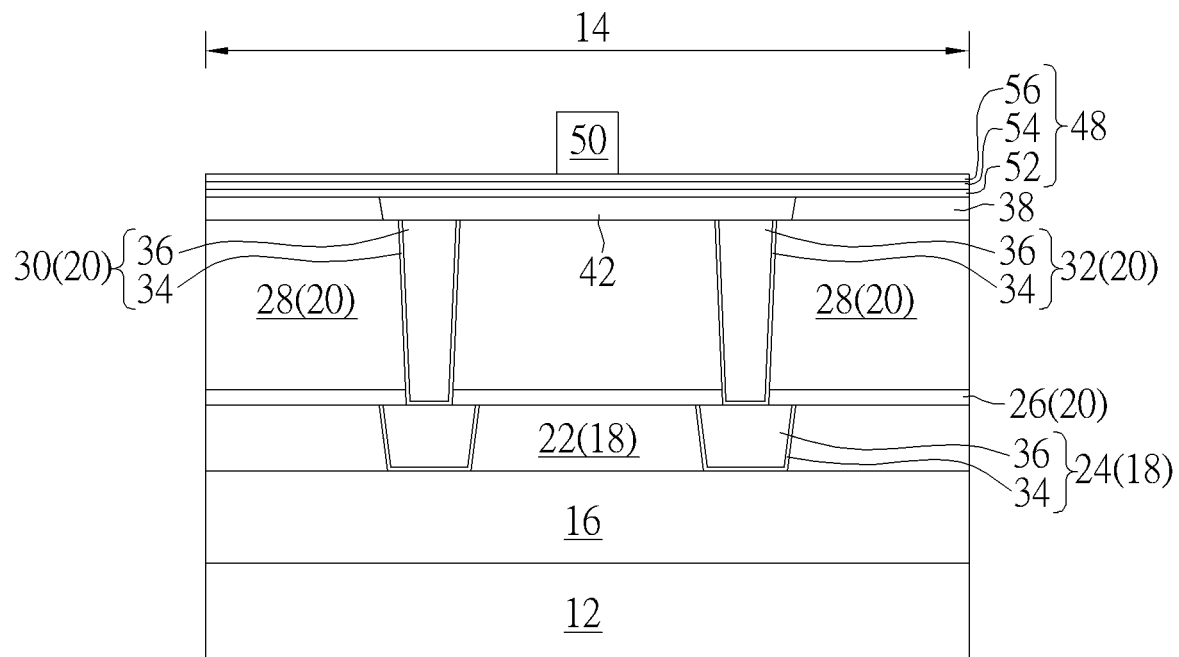

Next, as shown in FIG. 3, a MTJ stack 48 or stack structure is formed on the channel layer 42 and the stop layer 38 and a patterned hard mask 50 is formed on the MTJ stack 48. In this embodiment, the formation of the MTJ stack 48 could be accomplished by sequentially depositing a free layer 52, a barrier layer 54, and a pinned layer 56 on the channel layer 42. Preferably, the free layer 52 could be made of ferromagnetic material including but not limited to for example iron, cobalt, nickel, or alloys thereof such as cobalt-iron-boron (CoFeB), in which the magnetized direction of the free layer 52 could be altered freely depending on the influence of outside magnetic field. The barrier layer 54 could be made of insulating material including but not limited to for example oxides such as aluminum oxide ($AlO_x$) or magnesium oxide (MgO). The pinned layer 56 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 56 is formed to fix or limit the direction of magnetic moment of adjacent layers. It should be noted that since the present embodiment pertains to fabricating a SOT MRAM device, the free layer 52 is preferably disposed on the bottommost layer to contact the channel layer 42 directly. Preferably, the patterned mask 50 could include conductive material including but not limited to for example metal or metal nitride, in which metal could include titanium (Ti) while metal nitride could include titanium nitride (TiN).

Figure 4:
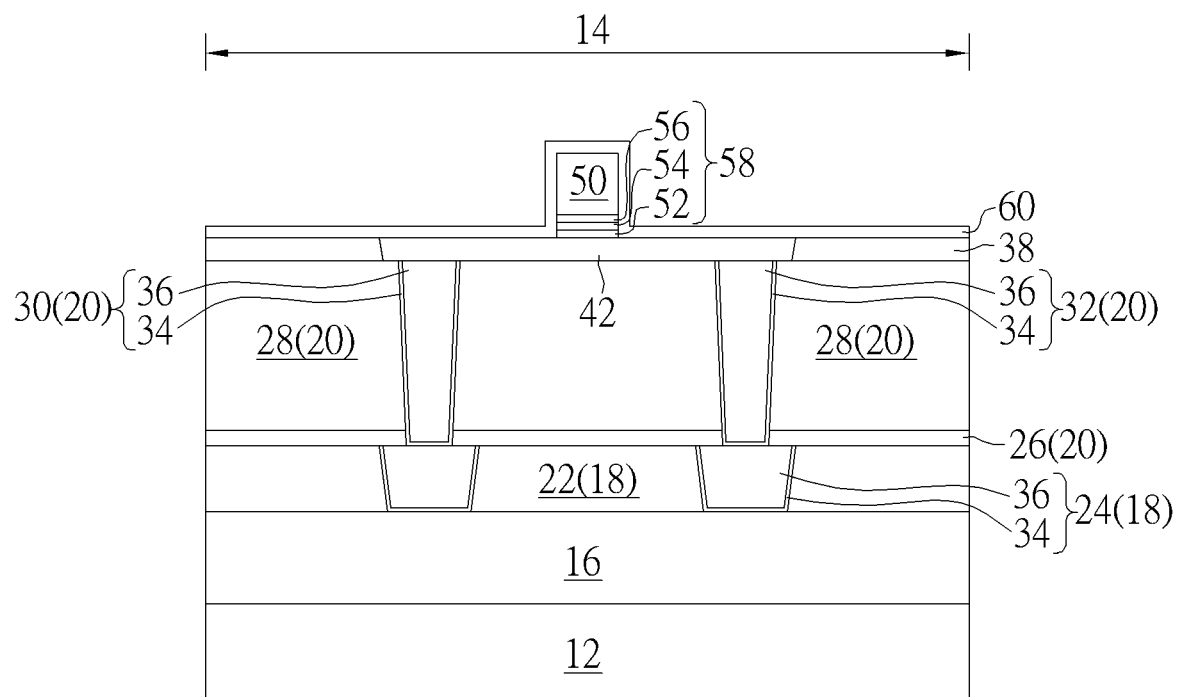

Next, as shown in FIG. 4, one or more etching process is conducted by using the patterned hard mask 50 as mask to remove part of the MTJ stack 48 for forming a MTJ 58 on the channel layer 42, and a cap layer 60 is formed on the surface of the hard mask 50, MTJ 58, channel layer 42, and stop layer 38. Since the channel layer 42 is not etched during the patterning of the MTJ stack 48, the top surface of the channel layer 42 is preferably even with the top surface of the surrounding stop layer 38. Preferably, the cap layer 60 is made of nitrogen doped carbide (NDC), silicon nitride (SiN), silicon carbon nitride (SiCN), or combination thereof and most preferably made of SiN.

Figure 5:
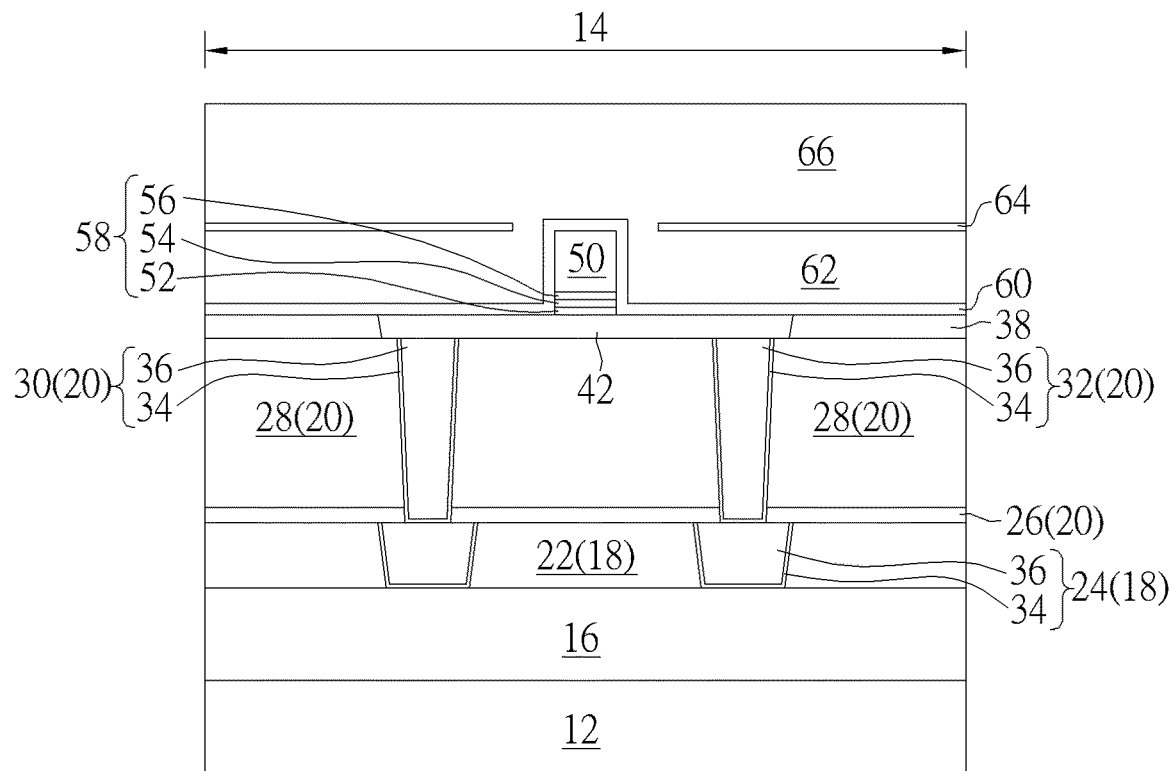

Next, as shown in FIG. 5, an IMD layer 62 and a stop layer 64 are formed on the cap layer 60, a planarizing process such as CMP is conducted to remove part of the stop layer 64 and part of the IMD layer 62, and another IMD layer 66 is formed on the stop layer 64 thereafter. In this embodiment, the IMD layers 62, 66 preferably include an ultra low-k (ULK) dielectric layer including but not limited to for example porous material or silicon oxycarbide (SiOC) and the stop layer 64 preferably includes nitrogen doped carbide (NDC), silicon nitride (SiN), silicon carbon nitride (SiCN), or combination thereof and most preferably includes SiN.

Figure 6:
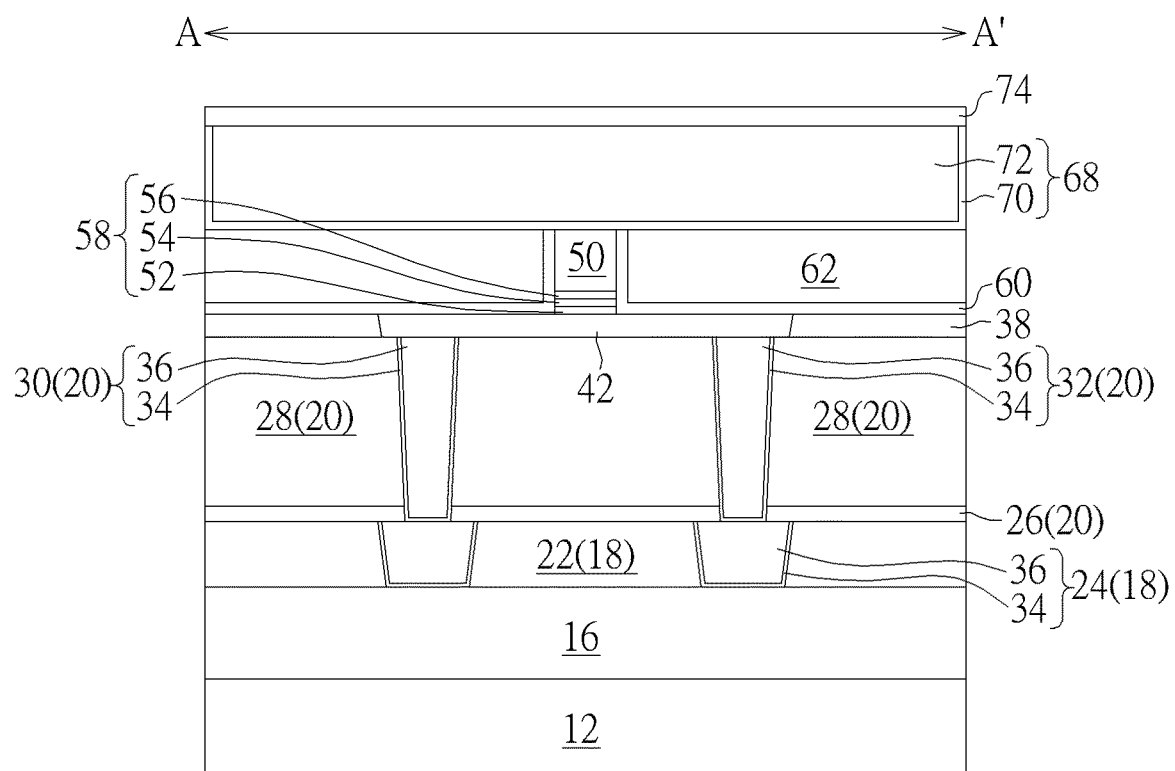

Next, as shown in FIG. 6, one or more photo-etching process is conducted to remove part of the IMD layer 66, part of the stop layer 64, and part of the IMD layer 62 to form contact holes (not shown) exposing the hard mask 50. Next, conductive materials are deposited into the contact holes and planarizing process such as CMP is conducted to form metal interconnections 68 connecting the hard mask 50 underneath, and another stop layer 74 is formed on the surface of the metal interconnections 68 thereafter. Similar to the aforementioned metal interconnections 24, the metal interconnections 68 could be embedded within the IMD layers 62, 66 according to a single damascene process or dual damascene process. For instance, each of the metal interconnections 68 could further include a barrier layer 70 and a metal layer 72, in which the barrier layer 70 could be selected from the group consisting of titanium (Ti), titanium nitride (TiN), tantalum (Ta), and tantalum nitride (TaN) and the metal layer 72 could be selected from the group consisting of tungsten (W), copper (Cu), aluminum (Al), titanium aluminide (TiAl), and cobalt tungsten phosphide (CoWP). In this embodiment, the metal layers 72 in the metal interconnections 68 preferably include copper and the stop layer 74 preferably includes nitrogen doped carbide (NDC), silicon nitride (SiN), or silicon carbon nitride (SiCN) and most preferably include SiCN. This completes the fabrication of a semiconductor device according to an embodiment of the present invention.

Figure 7:
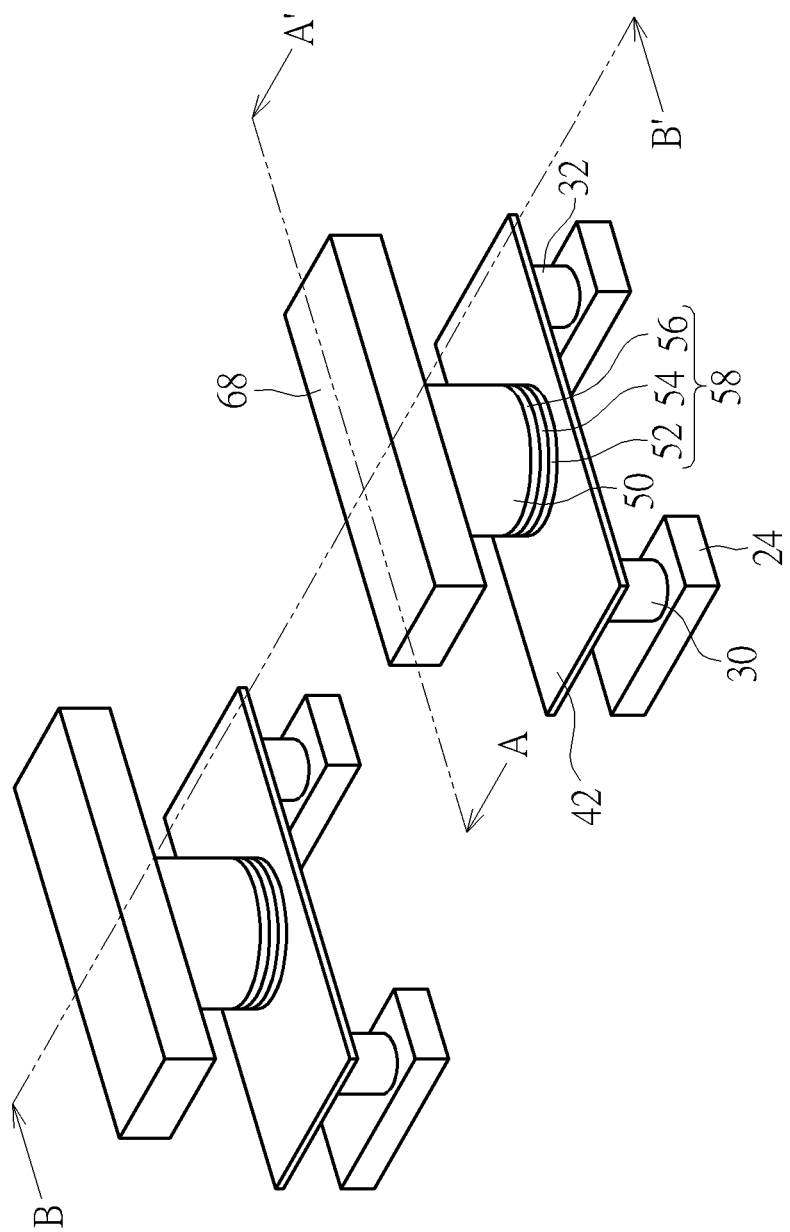
FIG. 7 illustrates a 3-dimensional structural view of two MRAM units arranged in an array according an embodiment of the present invention.
Figure 8:
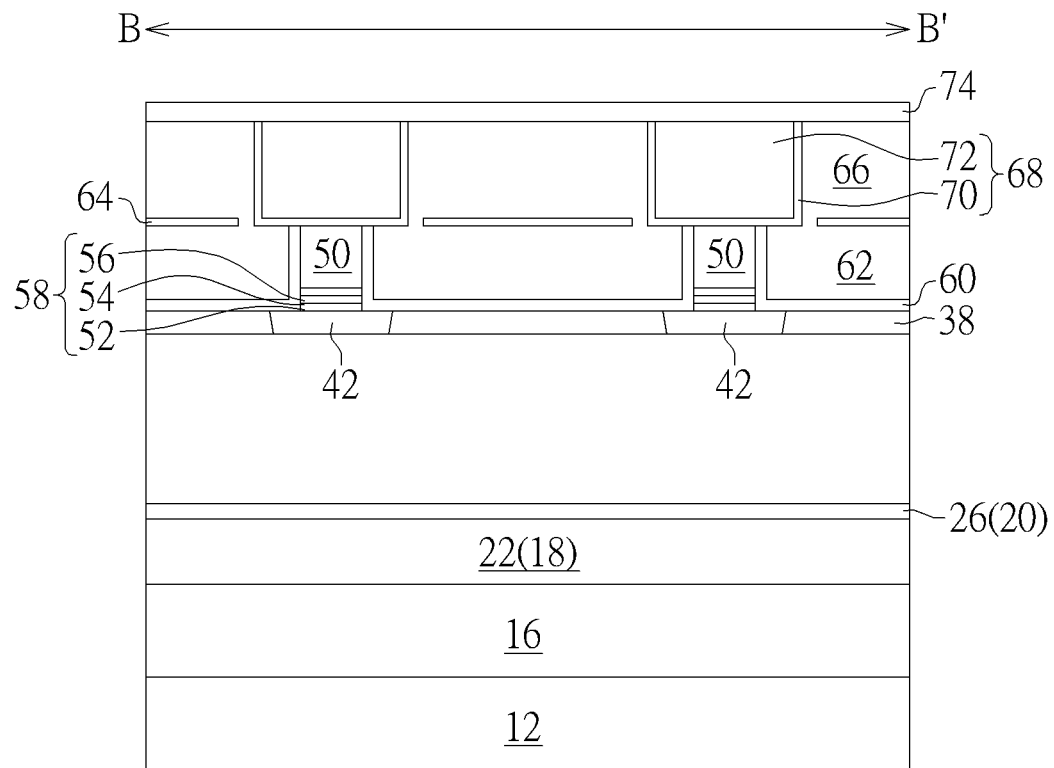
FIG. 8 illustrates a cross-section view of FIG. 7 taken along the sectional line BB'.

Referring to FIGS. 6-8, in which FIG. 7 illustrates a 3-dimensional structural view of two MRAM units arranged in an array according an embodiment of the present invention, FIG. 6 illustrates a cross-section view of FIG. 7 taken along the sectional line AA', and FIG. 8 illustrates a cross-section view of FIG. 7 taken along the sectional line BB'. As shown in FIGS. 6-8, each of the MRAM units preferably include metal interconnections 30 and 32 disposed on the substrate 12, an IMD layer 28 surrounding the metal interconnections 30, 32, a channel layer 42 disposed on the IMD layer 28 and directly contacting the metal interconnections 30, 32, a stop layer 38 around the channel layer 42, and a MTJ 58 disposed on the channel layer 42.

Viewing from a more detailed perspective, sidewalls of the MTJ 58 preferably include a planar surface, the top surfaces of the channel layer 42 and stop layer 38 are planar surfaces, and the top surfaces of the channel layer 42 and stop layer 38 are coplanar. Even though the left and sidewalls of the channel layer 42 shown in FIG. 6 overlap the sidewalls of the metal interconnections 30, 32 underneath, according to other embodiment of the present invention it would also be desirable to adjust the position of the channel layer 42 by retracting the channel layer 42 inward so that the left and right sidewalls of the channel layer 42 only overlap part of the metal interconnections 30, 32 without overlapping the entire metal interconnections 30, 32, aligned the sidewalls of the channel layer to sidewalls of the metal interconnections 30, 32, or extending the channel layer 42 toward left and right so that the channel layer 42 overlaps all of the metal interconnections 30, 32 and contacting the top surface of the IMD layer 28, which are all within the scope of the present invention. Moreover, in contrast the bottom surface of the channel layer 42 directly contacting the metal interconnections 30, 32 in FIG. 6, the channel layer 42 shown in FIG. 8 only contacts the IMD layer 28 while the IMD layers 62, 66 and the stop layer 64 are disposed adjacent to two sides of the metal interconnections 68 as the stop layer 64 is embedded in the IMD layers 62, 66 without contacting the metal interconnections 68 directly.

Figure 9:
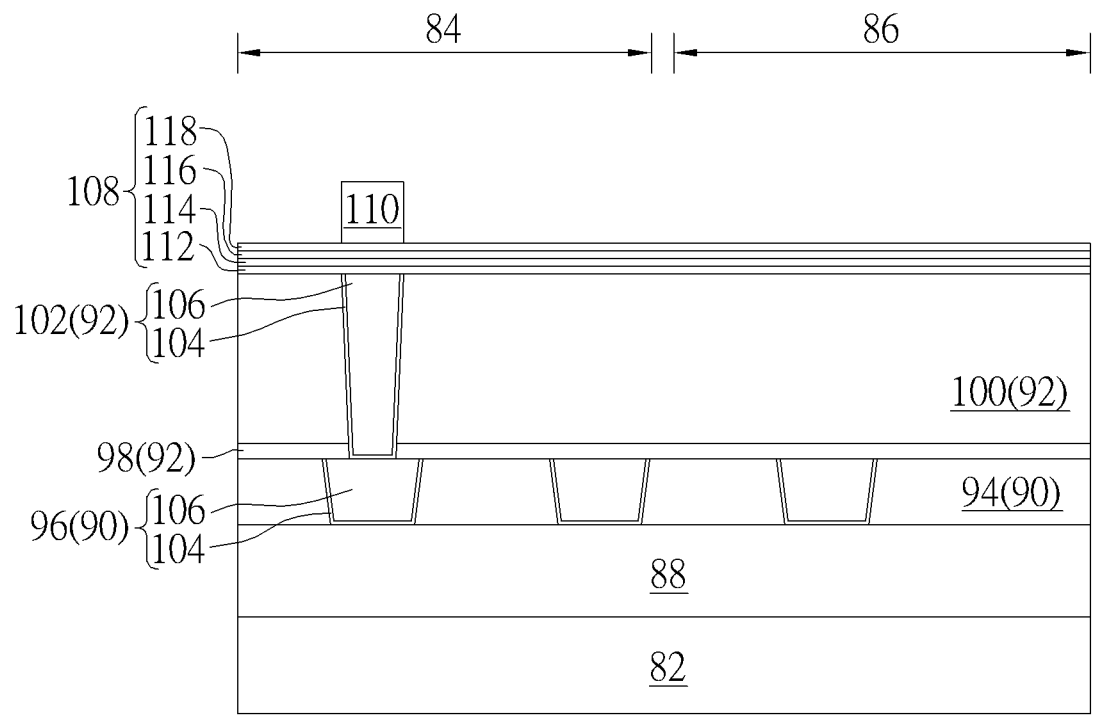
FIGS. 9-13 illustrate a method for fabricating a MRAM device according to an embodiment of the present invention.

Referring to FIGS. 9-13, FIGS. 9-13 illustrate a method for fabricating a MRAM device according to an embodiment of the present invention. As shown in FIG. 9, a substrate 82 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 84 and a logic region 86 are defined on the substrate 82.

Active devices such as metal-oxide semiconductor (MOS) transistors, passive devices, conductive layers, and interlayer dielectric (ILD) layer 88 could also be formed on top of the substrate 82. More specifically, planar MOS transistors or non-planar (such as FinFETs) MOS transistors could be formed on the substrate 82, in which the MOS transistors could include transistor elements such as gate structures (for example metal gates) and source/drain region, spacer, epitaxial layer, and contact etch stop layer (CESL). The ILD layer 88 could be formed on the substrate 82 to cover the MOS transistors, and a plurality of contact plugs could be formed in the ILD layer 88 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 90, 92 are sequentially formed on the ILD layer 88 to electrically connect the aforementioned contact plugs, in which the metal interconnect structure 90 includes an IMD layer 94 and metal interconnections 96 embedded in the IMD layer 94 and the metal interconnect structure 92 includes a stop layer 98, an IMD layer 100, and metal interconnection 102 embedded in the stop layer 98 and the IMD layer 100.

In this embodiment, each of the metal interconnections 96 from the metal interconnect structure 90 preferably includes a trench conductor and the metal interconnection 102 from the metal interconnect structure 92 on the MRAM region 84 includes a via conductor. Preferably, each of the metal interconnections 96, 102 from the metal interconnect structures 90, 92 could be embedded within the IMD layers 94, 100 and/or stop layer 98 according to a single damascene process or dual damascene process. For instance, each of the metal interconnections 96, 102 could further include a barrier layer 104 and a metal layer 106, in which the barrier layer 104 could be selected from the group consisting of titanium (Ti), titanium nitride (TiN), tantalum (Ta), and tantalum nitride (TaN) and the metal layer 106 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 106 in the metal interconnections 96 are preferably made of copper, the metal layer 106 in the metal interconnection 102 are preferably made of tungsten, the IMD layers 94, 100 are preferably made of silicon oxide or ultra low-k (ULK) dielectric layer, and the stop layer 98 is preferably made of nitrogen doped carbide (NDC), silicon nitride, silicon carbon nitride (SiCN), or combination thereof.

Next, a MTJ stack 108 or stack structure is formed on the metal interconnect structure 92 and a patterned hard mask 110 is formed on the MTJ stack 108. In this embodiment, the formation of the MTJ stack 108 could be accomplished by sequentially depositing an electrode layer 112, a pinned layer 114, a barrier layer 116, and a free layer 118. Preferably, the electrode layer 112 and the hard mask 110 are made of conductive materials including but not limited to for example tantalum (Ta), tantalum nitride (TaN), platinum (Pt), copper (Cu), gold (Au), aluminum (Al), or combination thereof. The pinned layer 114 could be made of antiferromagnetic (AFM) material including but not limited to for example ferromanganese (FeMn), platinum manganese (PtMn), iridium manganese (IrMn), nickel oxide (NiO), or combination thereof, in which the pinned layer 56 is formed to fix or limit the direction of magnetic moment of adjacent layers. The barrier layer 116 could be made of insulating material including but not limited to for example oxides such as aluminum oxide ($AlO_x$) or magnesium oxide (MgO). The free layer 118 could be made of ferromagnetic material including but not limited to for example iron, cobalt, nickel, or alloys thereof such as cobalt-iron-boron (CoFeB), in which the magnetized direction of the free layer 118 could be altered freely depending on the influence of outside magnetic field.

Figure 10:
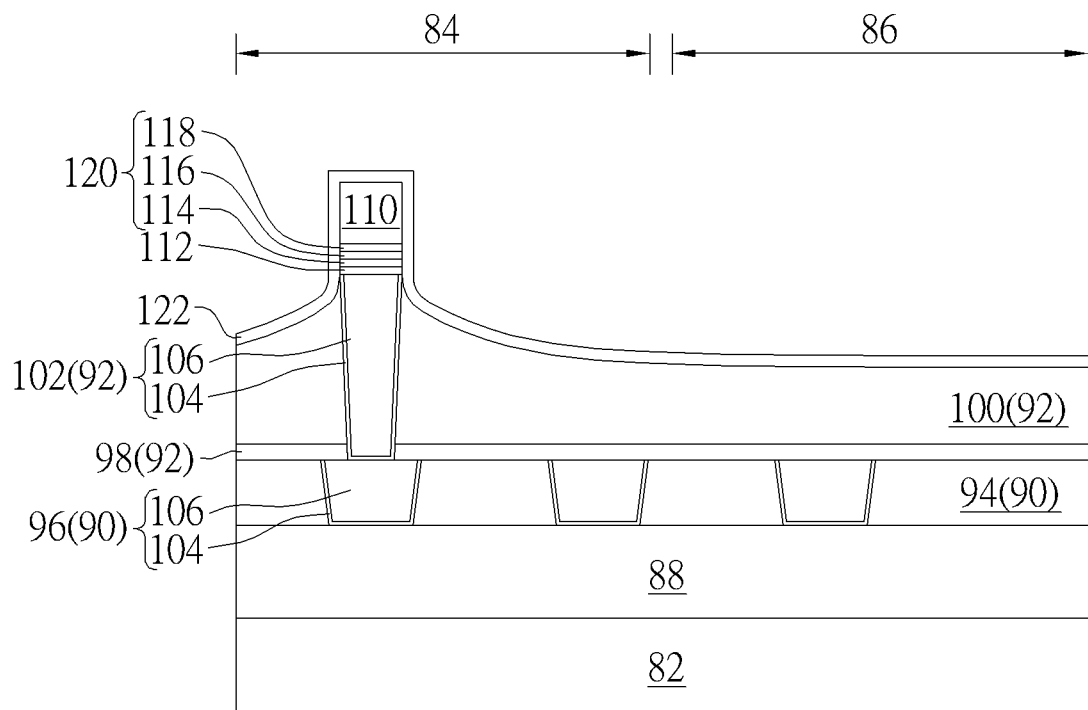

Next, as shown in FIG. 10, one or more etching process is conducted by using the patterned hard mask 110 as mask to remove part of the MTJ stack 108 and part of the IMD layer 100 for forming a MTJ 120 on the MRAM region 84, in which the electrode layer 112 preferably becomes a bottom electrode for the MTJ 120 at this stage. It should be noted that a reactive ion etching (RIE) process and/or an ion beam etching (IBE) process could be conducted to pattern the MTJ stack 120 and due to the characteristics of the IBE process, the top surface of the remaining IMD layer 100 could be slightly lower than the top surface of the metal interconnection 102 after the IBE process and the top surface of the IMD layer 100 also reveals a curve or an arc. Next, a cap layer 122 is formed on the MTJ 120 and covering the surface of the IMD layer 100. In this embodiment, the cap layer 122 preferably includes silicon nitride, but could also include other dielectric material including but not limited to for example silicon oxide, silicon oxynitride (SiON), or SiCN depending on the demand of the product.

Figure 11:
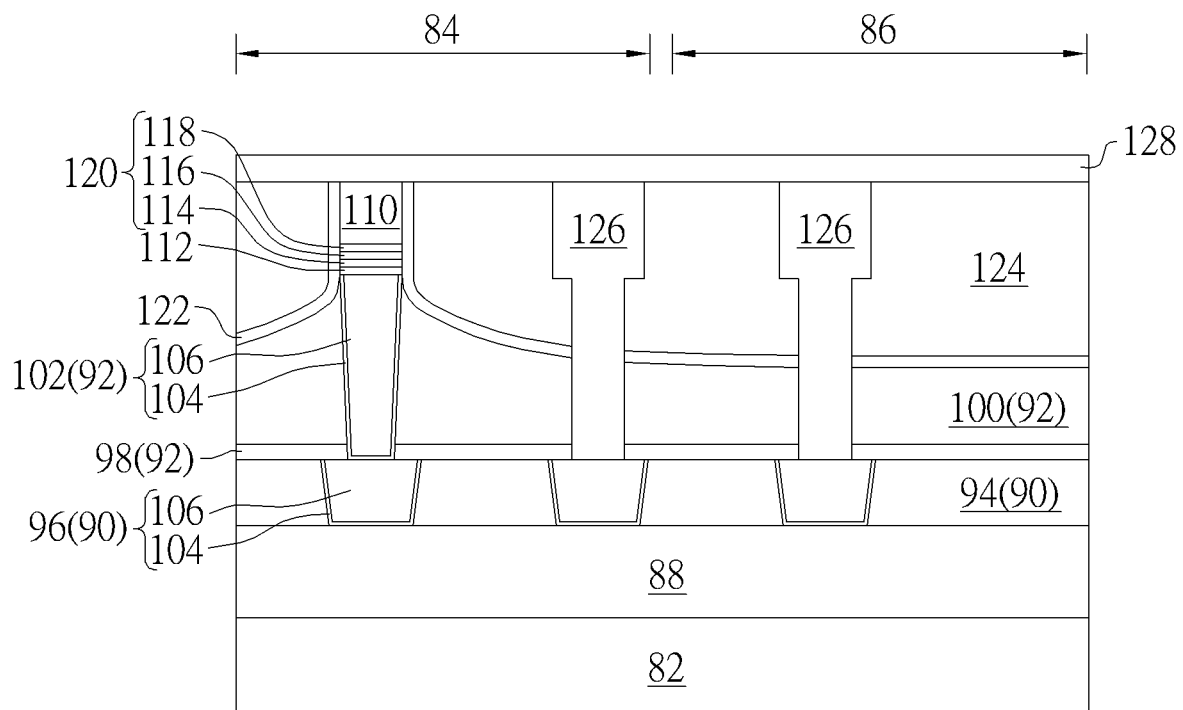

Next, as shown in FIG. 11, an IMD layer 124 and a stop layer (not shown) are formed on the surface of the cap layer 122, a planarizing process such as CMP is conducted to remove part of the stop layer and part of the IMD layer 124 and even part of the hard mask 110 so that the top surface of the IMD layer 124 is even with the top surface of the cap layer 122. Next, a pattern transfer process is conducted by using a patterned mask (not shown) to remove part of the IMD layer 124, part of the cap layer 122, part of the IMD layer 100, and part of the stop layer 98 on the MRAM region 84 adjacent to the MTJ 120 and on the logic region 86 to form contact holes (not shown) exposing the metal interconnections 96 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact holes, and a planarizing process such as CMP could be conducted to remove part of the conductive materials including the aforementioned barrier layer and metal layer to form a contact plugs or metal interconnections 126 in the contact hole electrically connecting the metal interconnection 96.

Next, another stop layer 128 is formed on the IMD layer 124 and the metal interconnections 126. In this embodiment, the stop layer 128 is formed to accommodate a channel layer formed afterwards hence the thickness of the stop layer 128 is maintained between 200 Angstroms to 300 Angstroms. Preferably, the stop layer 128 could include silicon dioxide (SiO$_2$), silicon nitride (SiN), or silicon carbon nitride (SiCN) and most preferably include SiCN.

Figure 12:
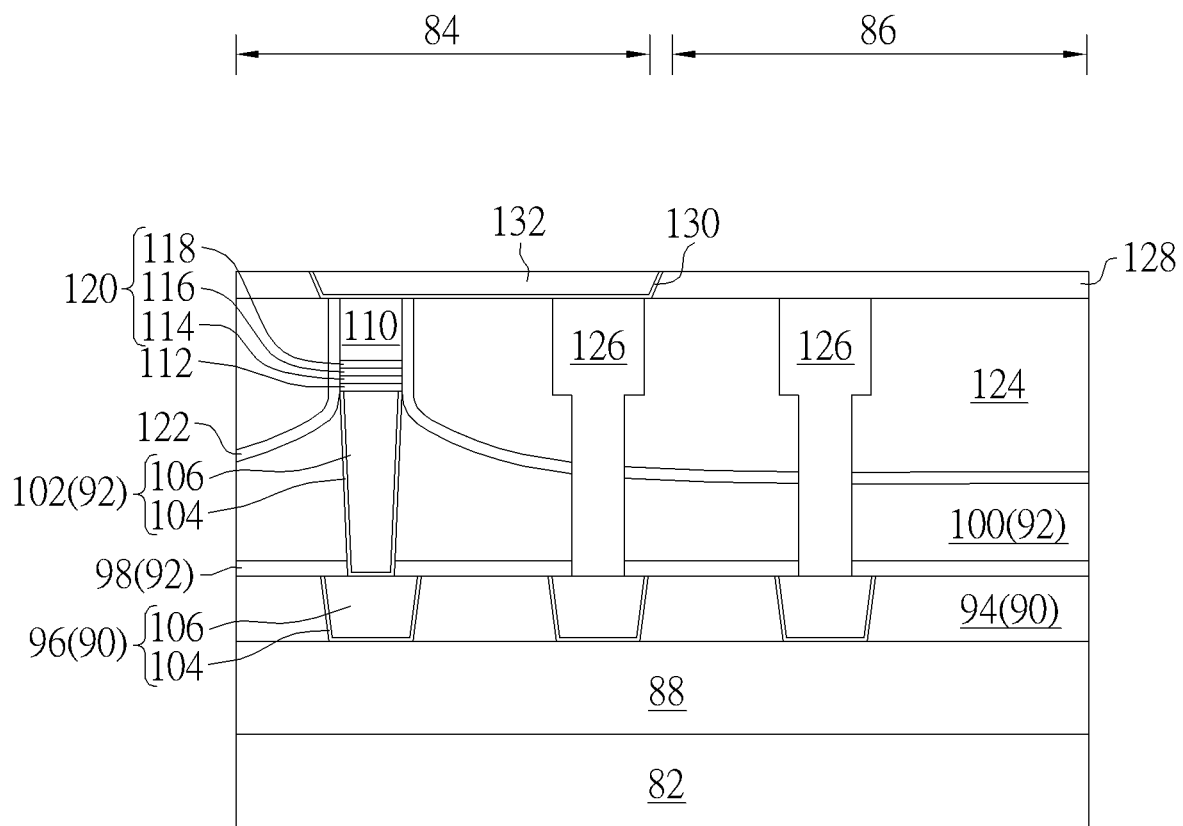

Next, as shown in FIG. 12, a photo-etching process is conducted to remove part of the stop layer 128 for forming an opening (not shown) exposing the hard mask 110 and the metal interconnection 126 adjacent to the MTJ 120. Next, a barrier layer 130 and a channel layer 132 are formed into the opening and on top of the stop layer 128, and a planarizing process such as CMP is conducted to remove part of the channel layer 132 and part of the barrier layer 130 so that the top surface of the remaining barrier layer 130 and channel layer 132 is even with the top surface of the stop layer 128. In this embodiment, the channel layer 132 is preferably serving as the channel for a spin orbit torque (SOT) MRAM and the material thereof could include tantalum (Ta), tungsten (W), platinum (Pt), hafnium (Hf), bismuth selenide (Bi$_x$Se$_{1-x}$), or combination thereof, and the barrier layer 130 preferably includes Ta or TaN while the channel layer 132 includes W.

Figure 13:
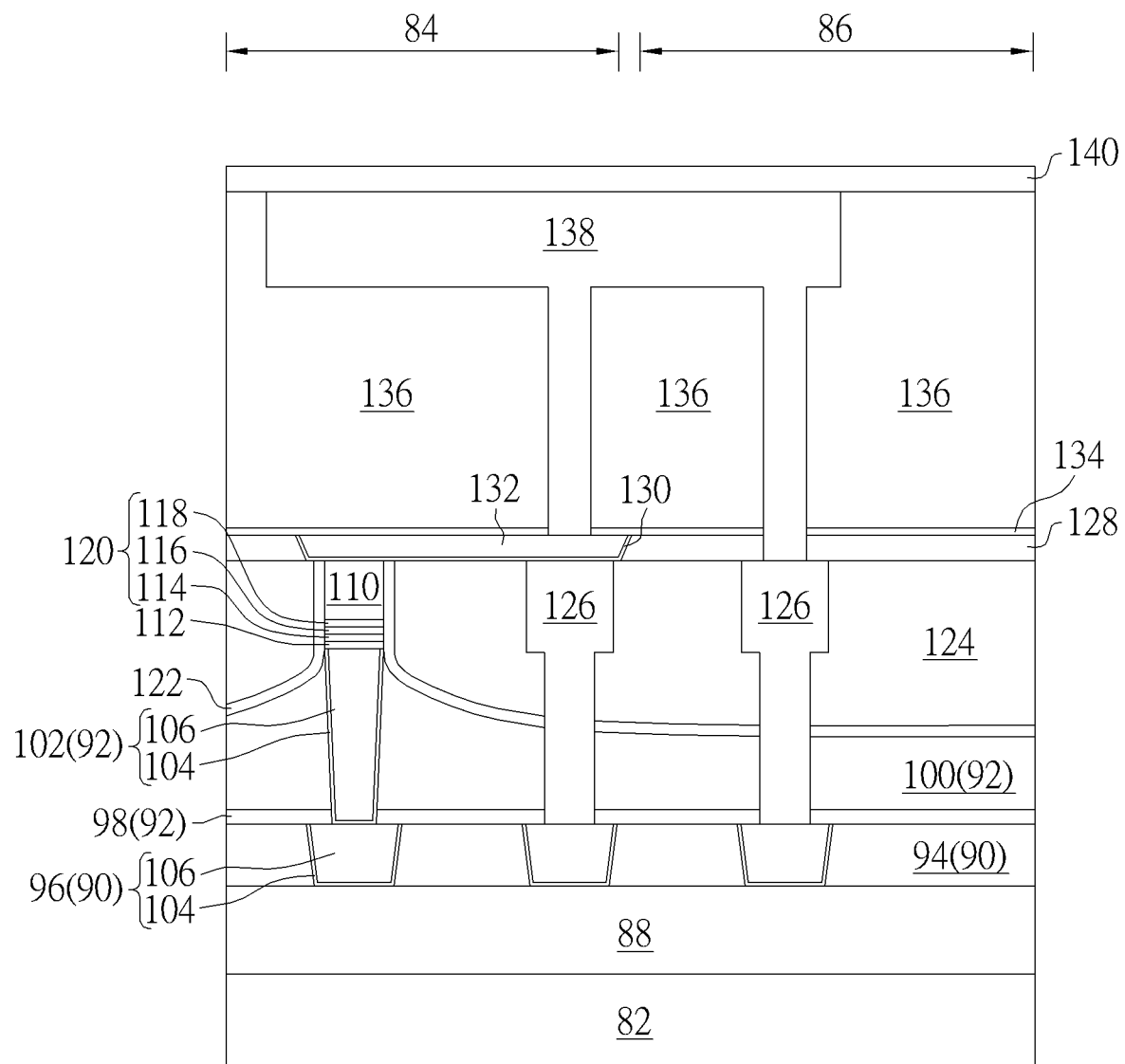

Next, as shown in FIG. 13, a stop layer 134 and another IMD layer 136 are formed on the channel layer 132 to cover the surface of the stop layer 128, and one or more photo-etching process is conducted to remove part of the IMD layer 136 and part of the stop layer 134 on the MRAM region 84 and part of the IMD layer 136, part of the stop layer 134, and part of the stop layer 128 on the logic region 86 to form contact holes (not shown). Next, conductive materials are deposited into each of the contact holes and a planarizing process such as CMP is conducted to form metal interconnections 138 on the MRAM region 84 and logic region 86 connecting the channel layer 132 and metal interconnection 126 underneath, in which the metal interconnection 138 on the MRAM region 84 directly contacts the channel layer 132 underneath while the metal interconnection 138 on the logic region 86 directly contacts the metal interconnection 126 on the lower level. Next, another stop layer 140 is formed on the IMD layer 136 to cover the metal interconnections 138.

In this embodiment, the stop layers 128 and 140 are preferably made of same material while the two layers 128, 140 and the stop layer 134 are made of different materials, in which the three layers 128, 134, 140 could all include nitrogen doped carbide (NDC), silicon nitride, silicon carbon nitride (SiCN), or combination thereof. In this embodiment, the stop layers 128, 140 are preferably made of SiCN while the stop layer 134 is made of silicon oxide or silicon nitride. Similar to the metal interconnections formed previously, each of the metal interconnections 138 could be formed in the IMD layer 136 through a single damascene or dual damascene process. For instance, each of the metal interconnections 138 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring again to FIG. 13, FIG. 13 further illustrates a structural view of a semiconductor device according to an embodiment of the present invention. As shown in FIG. 13, the semiconductor device includes a MTJ 120 disposed on the substrate 82, a metal interconnection 126 disposed adjacent to the MTJ 120 on the MRAM region 84, an IMD layer 124 around the MTJ 120 and the metal interconnection 126, a channel layer 132 and barrier layer 130 disposed on the IMD layer 124 to electrically or directly contacting the hard mask 110 and metal interconnection 126 at the same time, and a metal interconnection 102 disposed directly under the MTJ 120, in which the bottom surface of the metal interconnection 102 is even with the bottom surface of the metal interconnection 126 adjacent to the MTJ 120. The semiconductor device also includes a stop layer 128 surrounding the barrier layer 130 and channel layer 132, in which the top surfaces of the channel layer 132 and stop layer 128 are coplanar and the channel layer 132 and the metal interconnection 126 are preferably made of different materials. Preferably, the metal interconnections 126 and the metal interconnections 96 disposed on the MRAM region 84 and logic region 86 are made of Cu while the channel layer 132 could include tantalum (Ta), tungsten (W), platinum (Pt), hafnium (Hf), bismuth selenide (Bi$_x$Se$_{1-x}$), or combination thereof Overall, in contrast to current MRAM devices of utilizing a spin torque transfer (STT) approach for switching magnetic moments, the present invention pertains to fabricating a spin orbit torque (SOT) MRAM device that principally uses a SOT effect to switch the magnetic moment within the free layer, or more specifically induces switching of the free layer of the MTJ by injecting an in-plane current in an adjacent SOT layer (or the aforementioned channel layer), typically with the assistance of the state in-plane magnetic field. This enables a three terminal MTJ-based concept that isolates the read/write path, significantly improving the device endurance and read stability.

Under actual fabrication, the present invention preferably employs a damascene process to fabricate a channel layer of the SOT MRAM deice, in which the channel layer could be connected to the bottom side of the MTJ according to the embodiment disclosed in FIGS. 1-6 or connected to the top side of the MTJ according to the embodiment disclosed in FIGS. 9-13. Preferably, the channel layer could include metals such as tantalum (Ta), tungsten (W), platinum (Pt), or hafnium (Hf), and/or topological insulator such as bismuth selenide ($Bi_xSe_{1-x}$).

Since the switching of SOT MRAM is typically achieved by spin current affecting the magnetic moment of the free layer instead of providing current to the device directly, side effect such as reduction of coercivity in the magnetic layers, heating up of the entire MTJ by current, and continuous punch-through of insulating layer could be prevented during write operation of the device. Moreover since the spin current applies equal magnetic field to the entire magnetic layers at the same time so that the chance of switching is only determined by the magnitude of the current pulse applied, it would be desirable to boost up the speed of current plasma provided to the SOT devices than conventional STT devices thereby improving the write speed of the device significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a first metal interconnection and a second metal interconnection on a substrate;
    a first inter-metal dielectric (IMD) layer around the first metal interconnection and the second metal interconnection;
    a channel layer on the first IMD layer, the first metal interconnection, and the second metal interconnection;
    a magnetic tunneling junction (MTJ) on the channel layer;
    a first stop layer around the channel layer, wherein the channel layer and the first stop layer are made of different materials;
    a hard mask on the MTJ;
    a cap layer on the channel layer and the first stop layer and adjacent to the MTJ, wherein a cross-section of the cap layer comprises an L shape;
    a second IMD layer around the hard mask and the cap layer, wherein the cap layer and the second IMD layer comprise different materials;
    a third metal interconnection on and directly contacting the hard mask, wherein the third metal interconnection has a planar bottom surface directly contacting a top surface of the hard mask and a top surface of the second IMD layer, and a width of the planar bottom surface of the third metal interconnection is greater than a width of the channel layer;
    a second stop layer on the second IMD layer; and
    a third IMD layer on the second stop layer, wherein the second stop layer is disposed adjacent to two sides of the third metal interconnection, and the second stop layer is embedded in the second IMD layer and the third IMD layer without contacting the third metal interconnection directly.

2. The semiconductor device of claim 1, wherein the MTJ comprises:
    a free layer on the channel layer;
    a barrier layer on the free layer; and
    a pinned layer on the barrier layer.

3. The semiconductor device of claim 1, wherein top surfaces of the channel layer and the first stop layer are coplanar.

4. The semiconductor device of claim 1, wherein the third metal interconnection is on the MTJ, the cap layer, and the second IMD layer.

5. The semiconductor device of claim 1, wherein the channel layer comprises metal.

* * * * *